(12) United States Patent
Vettori

(10) Patent No.: US 8,981,803 B2
(45) Date of Patent: Mar. 17, 2015

(54) METHOD FOR CLEANING A CONTACT PAD OF A MICROSTRUCTURE AND CORRESPONDING CANTILEVER CONTACT PROBE AND PROBE TESTING HEAD

(71) Applicant: Technoprobe S.p.A., Cernusco Lombardone (IT)

(72) Inventor: Riccardo Vettori, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 284 days.

(21) Appl. No.: 13/661,980

(22) Filed: Oct. 26, 2012

(65) Prior Publication Data

US 2013/0049782 A1 Feb. 28, 2013

Related U.S. Application Data

(63) Continuation-in-part of application No. PCT/EP2011/002096, filed on Apr. 27, 2011.

(30) Foreign Application Priority Data

Apr. 28, 2010 (IT) .................. MI2010A000724

(51) Int. Cl.
*G01R 31/02* (2006.01)
*G01R 1/067* (2006.01)
*G01R 31/28* (2006.01)

(52) U.S. Cl.
CPC ........ *G01R 1/06727* (2013.01); *G01R 1/06733* (2013.01); *G01R 31/2898* (2013.01)
USPC ................... 324/754.01; 324/754.03

(58) Field of Classification Search
USPC ........................ 324/754.01, 754.03
See application file for complete search history.

(56) References Cited

U.S. PATENT DOCUMENTS

| | | | |
|---|---|---|---|
| 5,763,879 A | 6/1998 | Zimmer et al. | |
| 7,665,889 B2 * | 2/2010 | Kjoller et al. | 374/31 |
| 2003/0102878 A1 | 6/2003 | Montoya | |
| 2007/0229097 A1 | 10/2007 | Ishizuka | |
| 2008/0001612 A1 * | 1/2008 | Kister | 324/754 |

FOREIGN PATENT DOCUMENTS

JP 01219566 A 9/1989

OTHER PUBLICATIONS

Nadeau et al., "An Analysis of Tungsten Probes' Effect on Yield in a Production Wafer Probe Environment," IEEE International Test Conference, Paper 8.3, pp. 208-215, 1989.
Weeden, O., "Probe Card Tutorial," Retrieved from http://www.accuprobe.com/Downloads/Probe%20Card%20Tutorial.pdf, accessed Jan. 14, 2011, pp. 1-40, 2003.

* cited by examiner

*Primary Examiner* — Vincent Q Nguyen
(74) *Attorney, Agent, or Firm* — Seed IP Law Group PLLC

(57) ABSTRACT

A method for cleaning a contact pad of a microstructure or device to be tested when it is in electric contact with a measure apparatus, being obtained by electrically contacting a flexible probe with said contact pad. The method includes mechanically engaging a free end of the flexible probe in a manner that sticks the free end in the pad; and laterally flexing, by a tip charge, the flexible probe in a manner that keeps the free end stuck in the pad, so as to locally dig into a covering layer of the pad and realize a localized crushing thereof.

29 Claims, 9 Drawing Sheets

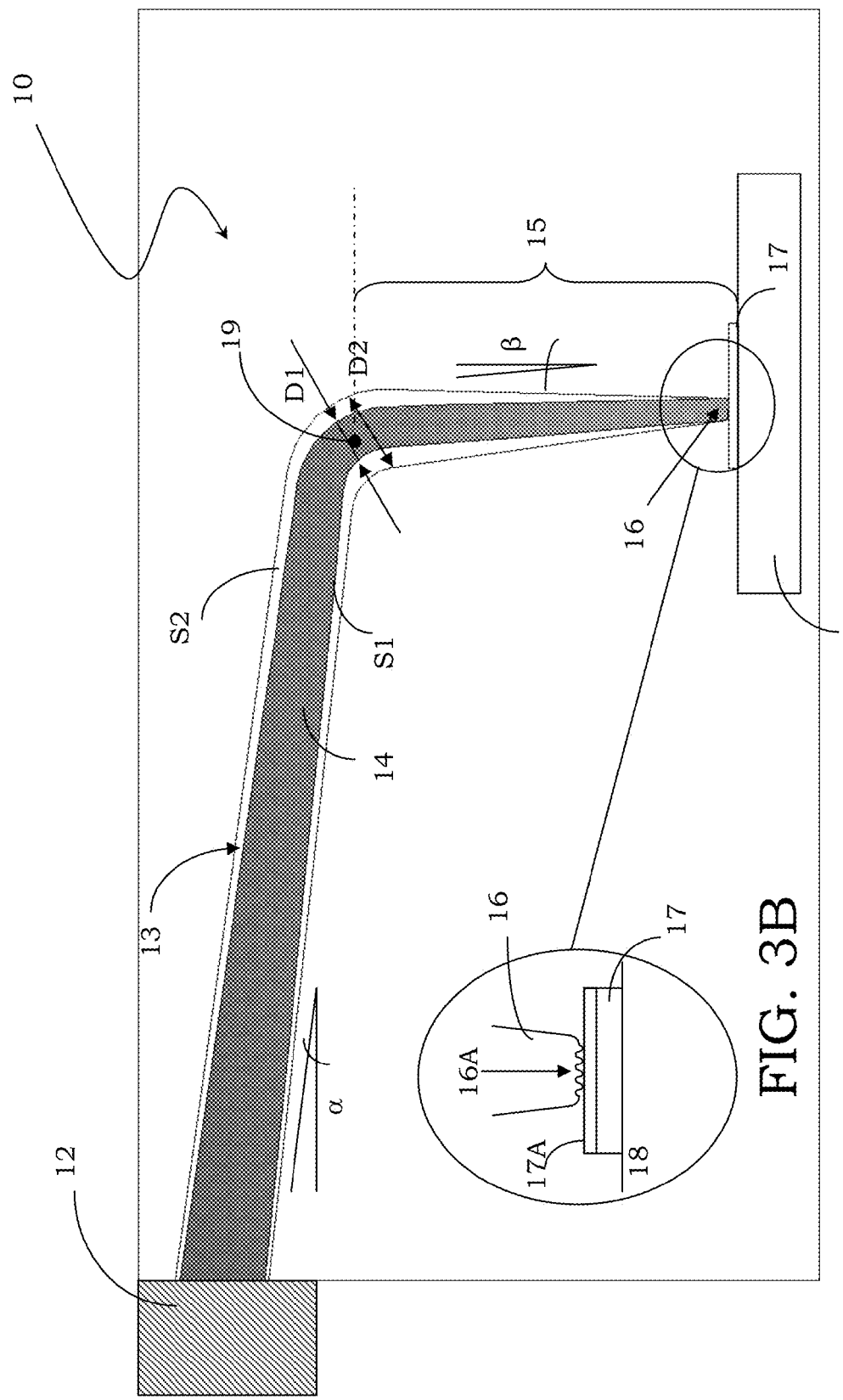

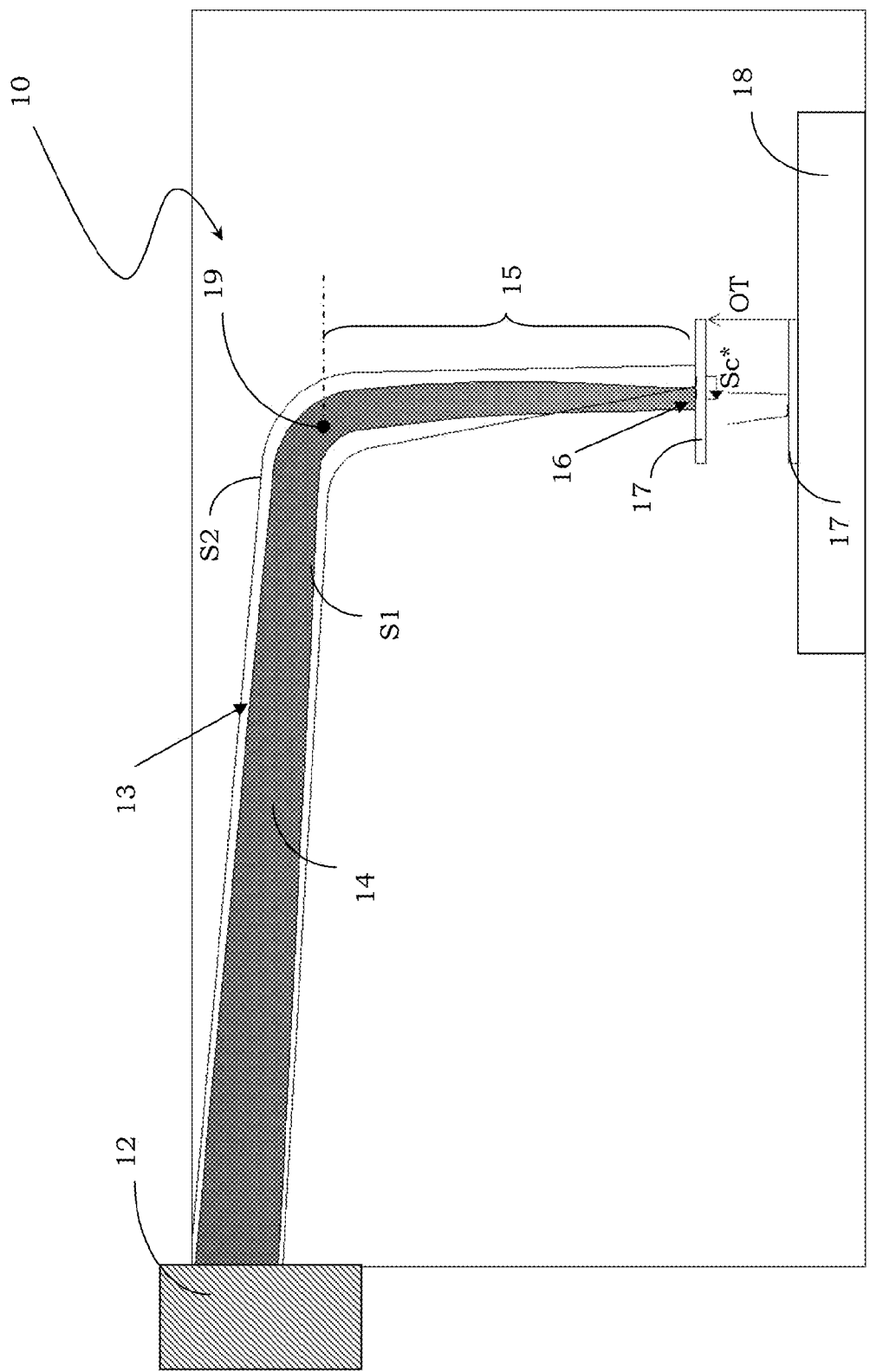

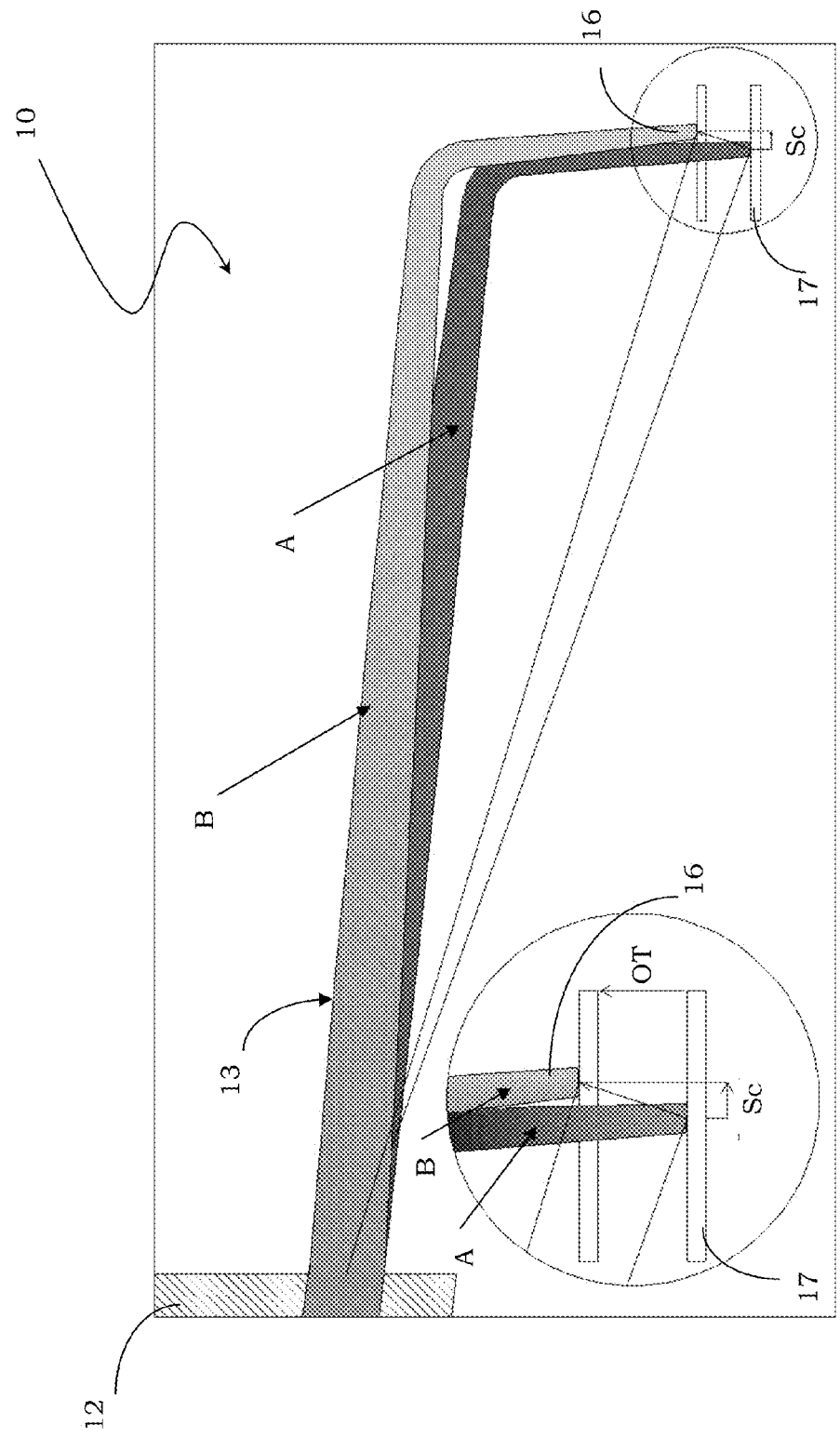

METHOD FOR CLEANING A CONTACT PAD OF A MICROSTRUCTURE AND CORRESPONDING CANTILEVER CONTACT PROBE AND PROBE TESTING HEAD

BACKGROUND

1. Technical Field

The present disclosure relates to a method for cleaning a contact pad of a microstructure or device to be tested when it is in electric contact with a measure apparatus.

The disclosure also relates to a cantilever contact probe and to a testing head comprising a plurality of cantilever contact probes.

2. Description of the Related Art

As it is well known, a testing head is a device being suitable to electrically connect a plurality of contact pads of a microstructure (such as an integrated circuit) with corresponding channels of a testing machine performing the test thereof.

The test performed on integrated circuits is for instance used to detect and isolate defective circuits already in the production step. Generally, testing heads are thus used to electrically test on-wafer integrated circuits before cutting and assembling them within a chip-containing package.

The efficiency and reliability of a measuring test depends, among other factors, to the realization of a good electrical contact between the microstructure and the measure apparatus and, thus, to a good electric contact between probe and pad.

Moreover, the electric connection between measure apparatus and microstructure, while good at the beginning, can substantially worsen over the time and even become null due to the deposition of dirt and to the formation of oxide on the contact pads of the microstructure to be tested.

For ensuring the reliability and efficiency of a testing head, a "cleaning" said contact pads should be provided.

Among the types of testing heads used in the technical field here considered to test integrated circuits, the so-called cantilever-probe testing heads are widely used, which are just probes projecting, like a fishing rod, over a device to be tested.

In particular, a cantilever testing head of the known type usually supports a plurality of probes, being flexible, usually thread-like, having prefixed electrical and mechanical properties. The probes, projecting in a cantilever manner from the testing head, have a substantially hooked structure, due to the presence of an end portion bent as an elbow which has an internal obtuse angle.

As schematically shown in FIG. 1A, a testing head 1 of this known type generally comprises at least a resin support 2, which is for example ring-shaped, being suitable to incorporate a plurality of mobile contact elements or probes 3, generally composed of special alloy wires with good electrical and mechanical properties, coming out through a projecting section thereof 4 from the resin support 2 with a suitable angle with respect to a plane of a device 8 to be tested, commonly called body angle, indicated with α in the enlarged view of FIG. 1B. These slanted probes 3 are commonly indicated with the English term "cantilever" and the related testing heads are called cantilever heads.

In particular, probes 3 have an end portion or hook 5, bending with a suitable angle with respect to a perpendicular to the device 8 to be tested, commonly called impact angle and indicated with β in the enlarged view of FIG. 1B. The hook 5 of each probe 3 ends with a contact tip 6 having a diameter Dt being suitable to abut and contact a plurality of contact pads 7 of the device 8 to be tested.

The term "Resin clearance", indicated in FIG. 1A with RCL, also identifies the difference between the height of a lower edge of the resin support 2 with respect to the plane of the device 8 to be tested, i.e. the contact pads 7, and a length H of the hook 5 of probes 3, as indicated in FIG. 1B.

The good connection between the probes 3 of the testing head 1 and the contact pads 7 of the device 8 to be tested could be ensured by the pressure of the testing head 1 on the device itself, probes 3 vertically bending (also with respect to the plane defined by the device to be tested) in the opposite direction to the device movement towards the testing head 1.

As schematically shown in FIGS. 2A and 2B with reference to a single probe 3, when the device 8 to be tested vertically moves against the hook 5 and the contact tip 6, the probe 3 bends, the projecting section 4 of the probe 3 thus forming a working arm for the probe itself in the vertical bending movement thereof, commonly indicated with the term "free length".

The hooked shape of the probes 3 is such as to allow, during the contact with the contact pads 7 of the device 8 to be tested and the travel upward of probes 3 beyond a preset contact point, commonly called "overtravel" and indicated with OT in the enlarged view of FIG. 2B, contact tips 6 of the probes 3 to slide on contact pads 7 over a length commonly called "scrub", indicated with Sc in the enlarged view of FIG. 2B. In particular, in these Figures, A indicates a first-contact starting position of the probe 3 with a contact pad 7 and B indicates a pressure-contact working position between the probe 3 and the pad 7, with subsequent horizontal movement or scrub of the contact tip 6 on the contact pad 7 and vertical movement or overtravel OT of the probe 3.

In other words, the contact between the probes 3 of the testing head 1 and the corresponding pads 7 of the microstructure or integrated circuit to be tested could be ensured by a suitable mutual approaching of the testing head and said integrated circuit. Due to this approaching, starting from the contact to the pads 7 of the integrated circuit, a lateral flexing of the end portion of the probes, whose free ends, i.e. the contact tips 6, are pressed to move, crawling on the pads 7 themselves, so as to realize the so-called "scrub" of these contact pads 7. To such a crawled movement corresponds a "scraping" or "brushing" of the surface of the contact pads 7, indeed, with a consequent removal of the dirt or oxide layer being in case on them.

The moving or crawled scrubbing of the contact tips 6 on the pads 7 should ensure a lasting optimal electric contact between the probes 3 and the pads 7 of the device 8 to be tested.

The correct working of a testing head is thus basically linked to two parameters: the vertical movement, or overtravel OT, of probes 3 and the horizontal movement, or scrub Sc, of contact tips 6 of such probes. In particular, a sufficient contact tip scrub on contact pads 7 should be ensured, which allows the pad surface to be "cleaned", improving the testing head 1 contact. The probes 3 of known testing heads essentially perform a "planning" of a surface of contact pads 7 removing the "dirt" thereon.

This technique, even advantageous when used for integrated circuits of the conventional type which have been used since lately, has an acknowledged bad technical drawback when used for cleaning recently designed integrated circuit. In fact, since some time, integrated circuits (and similar microstructures) are designed and provided being more and more full of contacts pads, the pads being smaller and smaller, for which the above described cleaning technique (removing of the superficial oxide layer) by a scrubbing movement being sufficiently and intentionally long, cause the overcoming of the pad outlines by the contact tips with a consequent loss of electrical contact and a risk of damaging the same device.

In particular, obtaining a sufficient scrub of the contact pads 7 in order to ensure an electrical contact with the device 8 to be tested in all working conditions of the testing head 1 could be in contrast with the present market need urging to design devices being denser and denser with contact pads 7 being smaller and smaller. The movement of contact tips 6 of probes 3 on contact pads 7 allowing a sufficient scrub Sc to be obtained is such that, in devices with reduced-size pads, the contact tip 6 risks going beyond the pad limits, thus subsequently not setting up the electrical connection with the device 8 to be tested and risking damaging the probe 3 or the device itself.

BRIEF SUMMARY

An embodiment of the present disclosure is directed to a method for cleaning the contact pads of a device to be tested when it is in electrical contact with a measure apparatus, which allows to optimally connect also devices having a high density of contact pads, and thus pads having reduced sizes, so as to overcome the drawbacks of the prior art.

The technique providing a superficial scraping or scrubbing of the contact pad, in the aim of removing the corresponding dirt or oxide layer, is then substituted with a technique providing a substantial tillage.

In particular, according to an embodiment of the disclosure, each contact probe is designed so as to limit the contact tip movement after the pressure contact thereof against a corresponding contact pad, ensuring however a correct electrical contact with the pad itself.

Another embodiment of the disclosure is directed to a method for cleaning a contact pad of a device to be tested when it is in electric contact with a measure apparatus, being obtained by electrically contacting a flexible probe with the contact pad, the method comprising the steps of:

mechanically engaging a free end of the flexible probe, being stuck in the pad; and laterally flexing, by means of a tip charge, the flexible probe by keeping the stuck, so as to locally dig into a covering layer of the pad and realize a localized crushing thereof.

More particularly, the disclosure comprises the following additional and optional features, being considered individually or combined, if necessary.

According to an aspect of the disclosure, local crushing of the covering layer of the contact pad could be a local removing of the same, substantially by milling.

According to another aspect of the disclosure the milling could be obtained by corrugating the pointed free end of the flexible probe.

According to a further aspect of the disclosure, flexing of the flexible probe could cause a local pressing of a removed portion of the covering layer.

Finally, according to yet another aspect of the disclosure, flexing of the flexible probe could cause a substantial straightening of said free end of said flexible probe in a position being substantially orthogonal with respect to said contact pad.

According to another embodiment of the disclosure, a cantilever contact probe is provided, which probe comprises at least a probe body and a hook-shaped end portion, slanting from a bending point onward with respect to the probe body and ending with a contact tip being suitable to ensure the mechanical and electrical contact with a contact pad of a device to be tested, the hook-shaped end portion being tapered and having a reduced diameter D1 in correspondence with the bending point and the contact tip comprising a suitably corrugated contact portion being able to abut against a covering film overhanging the contact pad.

According to an aspect of the disclosure, the corrugated contact portion may have a surface roughness being suitable to obtain a sufficient force of friction which is able to stick the contact tip on the contact pad in correspondence with an impact zone.

According to another aspect of the disclosure, the corrugated contact portion may have a surface roughness between 1 and 3 micron, preferably 2 micron.

Furthermore, according to an aspect of the disclosure, the hook-shaped end portion may have a diameter D1 in correspondence with the bending point having a value comprised between 10% and 30%, preferably equal to 20% of a value of the diameter of a known probe to be used for a same application.

According to a further aspect of the disclosure, the cantilever contact probe may be made of a tungsten alloy with 3% of rhenium having the feature of elastically bending keeping within an elastic deformation zone with a vertical movement of the probe up to 70 μm.

Moreover, according to an aspect of the disclosure, the hook-shaped end portion may have a length measured from the bending point to the contact tip which is equal to 270 μm±15 μm, preferably 270 μm. According to a preferred embodiment of the disclosure, the hook-shaped end portion may have a length measured from the bending point to the contact tip which is equal to 325 μm±15 μm, preferably 325 μm.

Finally, still according to another aspect of the disclosure, the hook-shaped end portion may bend with an angle β with respect to a perpendicular to the device to be tested comprised between 2° and 4°, preferably 3°.

According to yet another embodiment of the disclosure, a cantilever-probe testing head is provided, which head comprises at least a support intended to incorporate a plurality of contact probes of the above-mentioned type.

According to one aspect of the disclosure, the contact probes project in a cantilever way over the device to be tested with an angle α, defined by the slant of the probe with respect to a plane defined by the device to be tested, comprised between 4° and 8°, preferably 6°.

Finally, a method is provided for contacting a device to be tested by means of a testing head as above defined and comprising the steps of:

getting the corrugated contact portion of each of the contact tips in contact with a corresponding contact pad;

letting the contact tip penetrate in the covering film of the contact pad by a length of a thickness of the covering film;

sticking the contact tip on the contact pad by means of the friction generated by the corrugated contact portion in correspondence with a zone of impact with the covering film;

applying a pressure force on the probe vertically moving the device to be tested towards the testing head and elastically deforming the hook-shaped end portion of the probe;

letting the contact tip move in a rotating way in correspondence with the zone of impact with the covering film locally milling and removing the covering film and etching the underlying contact pad letting said contact tip penetrate by a length exceeding the thickness of the covering film; and realizing a desired electrical contact between the probe and the contact pad.

The features and advantages of the contact probe and testing head according to the disclosure will be apparent from the following description of some embodiments thereof, given by way of non-limiting examples with reference to the attached drawings.

BRIEF DESCRIPTION OF THE SEVERAL VIEWS OF THE DRAWINGS

FIG. 3A is a schematic sectional view of a cantilever-probe testing head according to an embodiment of the disclosure;

FIG. 3B is a schematic enlarged view of a portion of a cantilever probe of FIG. 3A;

FIG. 4 is a schematic view of the cantilever-probe testing head of FIG. 3A in a working step thereof;

FIG. 6A is a schematic sectional view of a cantilever-probe testing head of FIG. 3A in a working step thereof;

FIG. 6B is a schematic enlarged view of a portion of a cantilever probe of FIG. 6A;

DETAILED DESCRIPTION

Figures 1A, 1B:
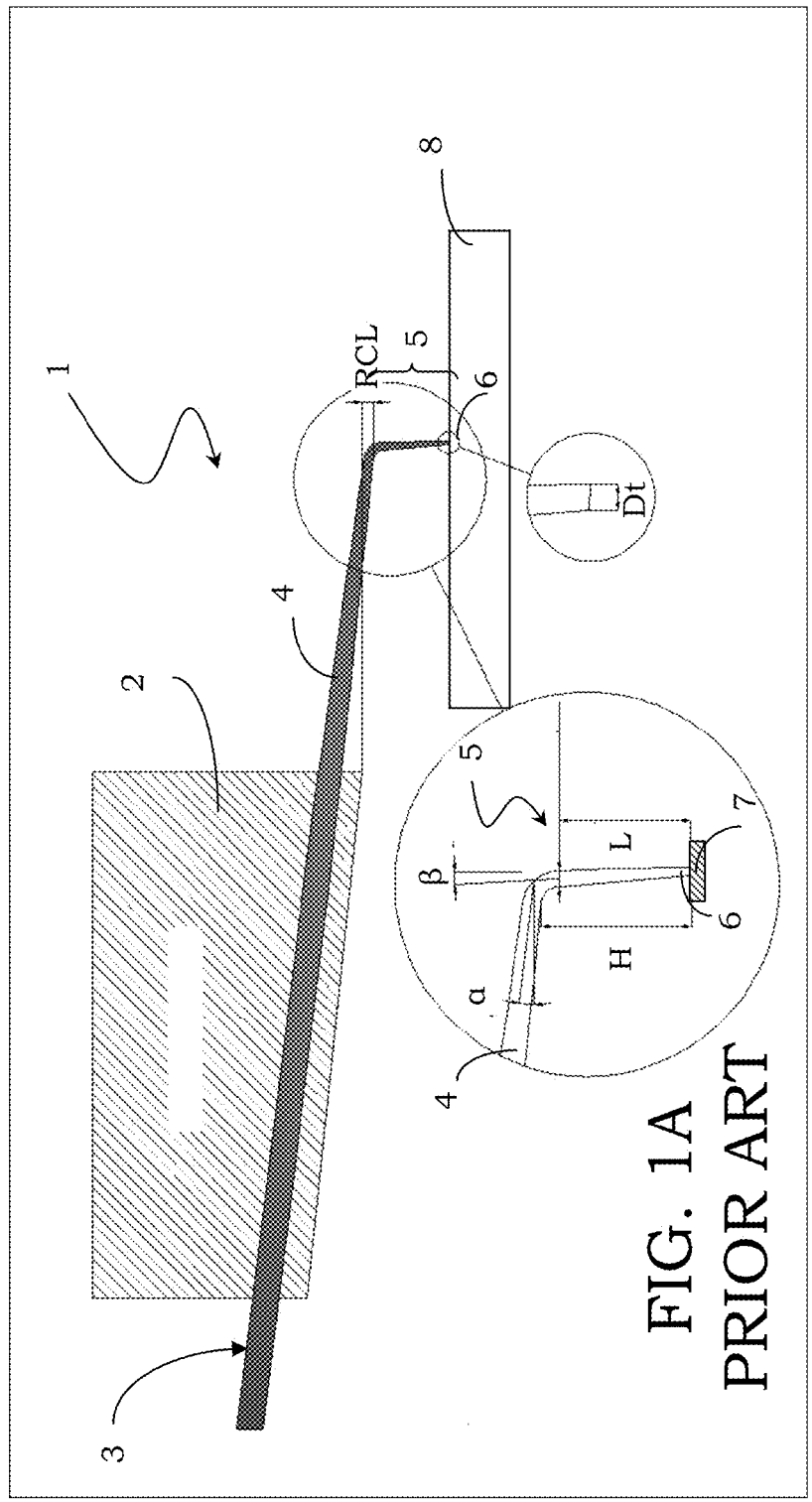
FIG. 1A is a schematic sectional view of a cantilever-probe testing head according to the prior art.
FIG. 1B is a schematic enlarged view of a portion of the cantilever-probe testing head of FIG. 1A.
Figures 2A, 2B:
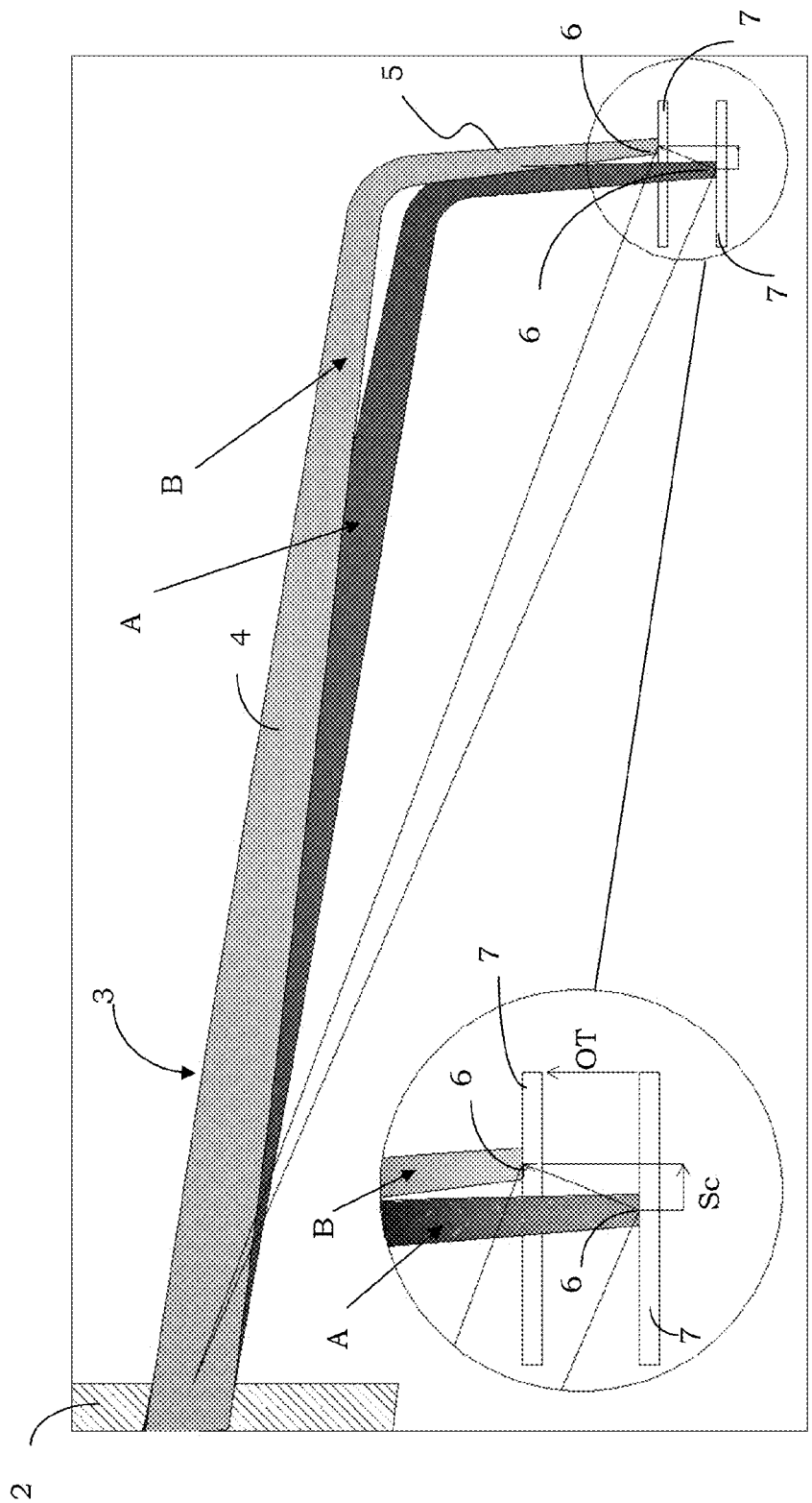
FIG. 2A is a schematic view of the cantilever-probe testing head of FIG. 1A in a working step thereof.
FIG. 2B is a schematic enlarged view of a portion of the cantilever-probe testing head of FIG. 2A.

In the following description, numerous specific details are given to provide a thorough understanding of embodiments. The embodiments can be practiced without one or more of the specific details, or with other methods, components, materials, etc. In other instances, well-known structures, materials, or operations, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

As will be clear from the following description, the methods and probes according to embodiments of the disclosure are particularly useful for very small pads, for instance having size of 50 μm×50 μm or even 40 μm×40 μm.

An embodiment of the disclosure is directed to a method for cleaning a contact pad of a microstructure or a device to be tested when it is in electric contact with a measure apparatus, being obtained by electrically contacting a flexible probe with said contact pad.

Advantageously according to this embodiment of the disclosure, the method for cleaning comprises the steps of:

mechanically engaging a free end of the flexible probe, being stuck in the pad; and laterally flexing, by means of a tip charge, said flexible probe by keeping the stuck, so as to locally dig into a covering layer, in particular dirt or oxide, of the pad and realize a localized crushing thereof.

In particular, the local crushing of the covering layer of the contact pad is a local removing of the same, substantially by milling, being advantageously obtained by corrugating the pointed free end of the flexible probe.

Referring in particular to FIG. 3A, it should be noted that a testing head 10 according to an embodiment of the disclosure, applied to at least one device 18 to be tested, comprises at least a resin support 12 being suitable to incorporate a plurality of mobile contact elements or probes 13, always composed of special alloy wires with good electrical and mechanical properties, coming out through a projecting section of the probe body 14 from the resin support 12 with a suitable angle with respect to a plane of a device 18 to be tested.

The testing head 10 is of the cantilever type with probes 13 projecting in a cantilever way over the device 18 to be tested with a body angle, indicated with α and defined by the slant of the probe 13 with respect to a plane defined by the device 18 to be tested. Advantageously according to an embodiment of the disclosure, this minimum body angle α (i.e. the body angle of the first-level probe) has an amplitude being lower than known testing heads, and particularly comprised between 4° and 8°, preferably 6°.

In particular, it can be verified that a reduction of the body angle α allows to further reduce the scrub length which is due to the probe tip on the contact pads.

Probes 13 have an end portion or hook 15, bent with a suitable angle with respect to a perpendicular to the device 18 to be tested, commonly called impact angle and indicated with β. Advantageously according to an embodiment of the disclosure, this impact angle β has an amplitude being lower than known testing heads, and particularly comprised between 2° and 4°, preferably 3°.

As it will be apparent from the following description, the values of the body angle α and of the impact angle β can be reduced by means of the configuration of probes 13 according to an embodiment of the disclosure having a reduced diameter D1 of the hook 15 in correspondence with a bending point 19 with respect to a diameter D2 of known probes, as indicated in FIG. 3A by the profile S1 of the probe 13 according to an embodiment of the disclosure and by the profile S2 of a known probe, indicated by way of comparison. In particular, the diameter D1 of the probe 13 in correspondence with the bending point 19 has a value comprised between 10% and 30%, preferably 20% of a value of the diameter of a probe being realized according to the prior art for a same application.

According to a preferred embodiment of the disclosure, the probe 13 has a diameter D1 of the hook 15 in correspondence with a bending point 19 having a value having a value being greater than a diameter of the contact tip, for approximately 15 μm. In particular, according to the preferred embodiment, the probe 13 is used for testing pads having size of 50 μm×50 μm or even 40 μm×40 μm. The usual values of the diameter of the contact tip is 16 μm±3 μm and the diameter D1 of the hook 15 in correspondence with a bending point 19 has a value of 31 μm±5 μm.

The hook 15 of each probe 13 ends with a contact tip 16 having substantially the same diameter as known probes, this tip 16 being suitable to abut and contact a plurality of contact pads 17 of the device 18 to be tested.

Advantageously according to an embodiment of the disclosure, as indicated in the enlarged view of FIG. 3B, the contact tip 16 has a suitably-corrugated contact portion 16A being suitable to abut against a covering layer or film 17A (oxide or dirt in general) overhanging the contact pad 17.

In this way, advantageously according to this embodiment of the disclosure, the contact tip 16 "sticks" in correspondence with the impact zone on the contact pad 17, limiting the scrub performed by the tip itself, as schematically indicated in FIG. 4, the probe 13 (profile S1) being in pressure contact with the contact pad 17, the same having performed a vertical movement or overtravel OT. Still in FIG. 4, by way of comparison, a known probe, profile S2, is also indicated.

As indicated in FIG. 4, the hook 15 of the probe 13 deforms on the occasion of the pressure contact against the contact pad 17, the horizontal movement or scrub thereof on the pad itself being limited by fixing the corrugated contact portion 16A, as it will explained in greater detail hereafter.

Advantageously according to an embodiment of the disclosure, due to the reduction of the diameter D1 of the contact probe 13 and to the subsequent tapered shape of the hook 15 (ending, as above mentioned, with a contact tip 16 with a diameter being comparable with known probes), the deformation of the hook 15 is elastic and not permanent or plastic, the probe 13 regaining its original shape once lifted from the device 8 to be tested, ready for a new contact.

Figure 5A:
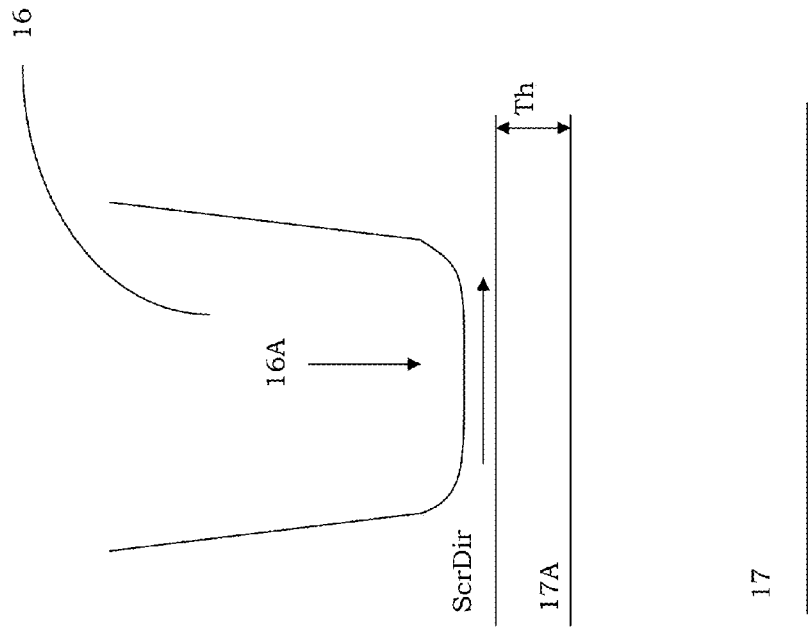
FIGS. 5A, 5B and 5C are schematic enlarged views of FIG. 3B in different working steps of the testing head of FIG. 3A, according to the IV-IV direction indicated in FIG. 5.
Figure 5:
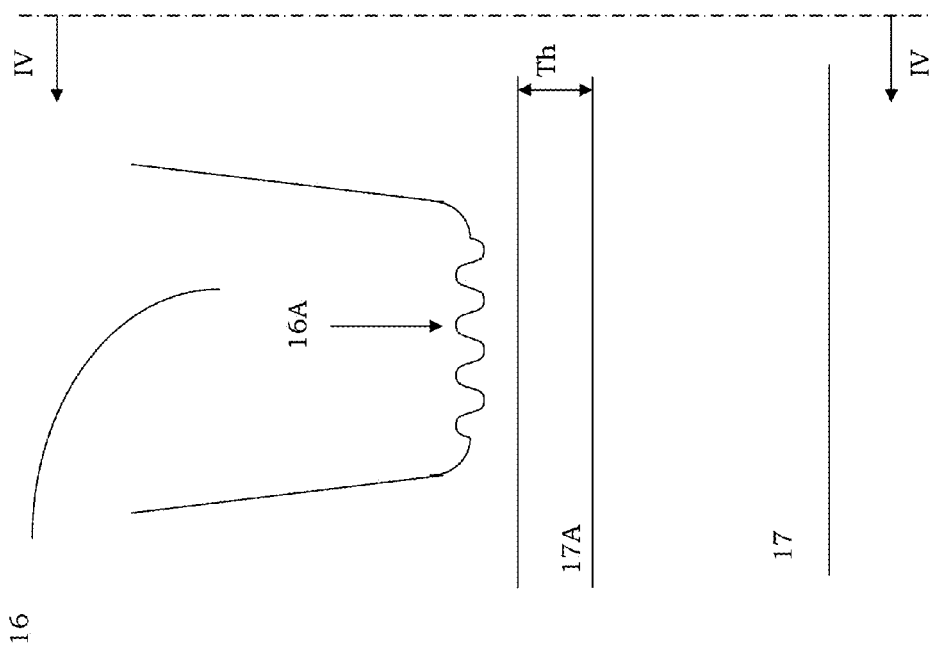
FIG. 5 shows in greater detail an enlarged view of a portion of the cantilever probe of FIG. 3B.
Figure 5C:
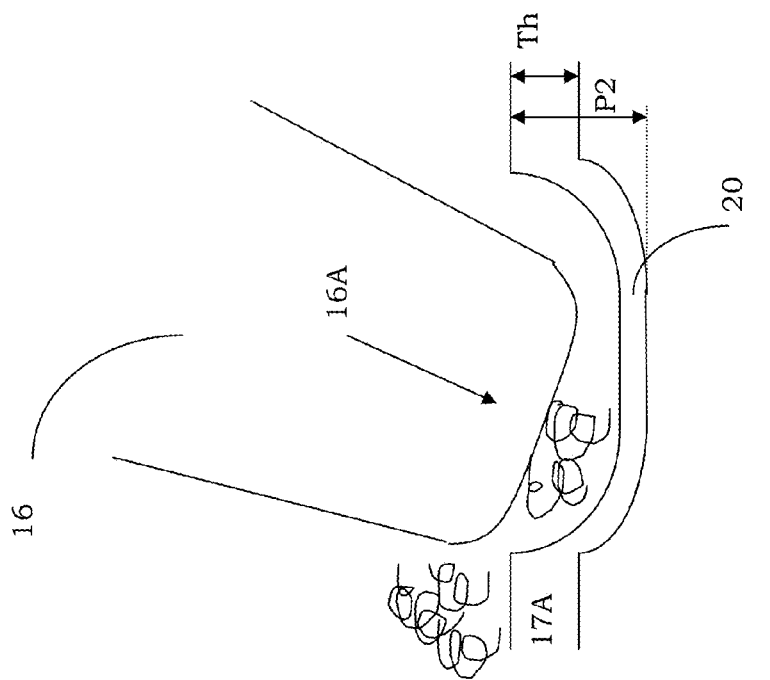
Figure 5B:
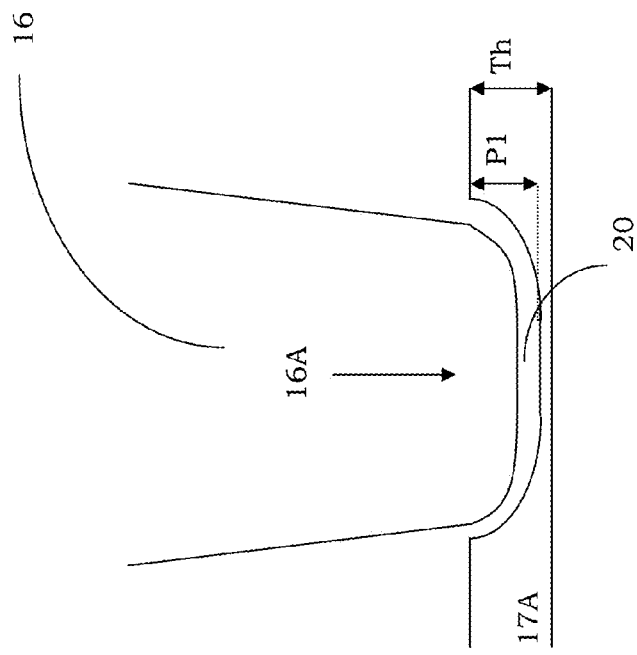

Further advantageously according to this embodiment of the disclosure, due to the corrugated contact portion 16A thereof, the contact tip 16 of the probe 13 removes anyhow the covering film 17A from the contact pad 17, ensuring the correct electrical contact of the probe 13 and thus the correct working of the testing head 10 comprising it, as shown in FIG. 5, according to an orthogonal direction to the scrub direction ScrDir, as indicated in FIG. 5A which is an orthogonal view with respect to FIG. 5, according to the IV-IV direction, as well as for the subsequent FIGS. 5B-5C.

In particular, as shown in FIGS. 5A-5C, the contact tip 16 thus "locally mills" the covering film 17A of the contact pad 17.

In particular, the corrugated contact portion 16A of the contact tip 16 comes into contact with the covering film 17A of the contact pad 17 (FIG. 5A) and it penetrates by a length P1 of the thickness Th of such a covering film 17A (FIG. 5B), sticking the contact tip 16 of the probe 13 on the contact pad 17.

The following application of the pressure force on the probe 13, given by the vertical movement of the device 18 to be tested towards the testing head 10 comprising it, causes a deformation of the hook 15 thereof, with a subsequent rotating movement of the contact tip 16 thereof (FIG. 5C), with a substantial straightening of the tip 16 in a position which is substantially orthogonal with respect to the contact pad 17. In this way, the corrugated contact portion 16A removes, through a local milling, the covering film 17A and it etches the underlying contact pad 17, penetrating by a length P2 exceeding the thickness Th of the covering film 17A, and actually performing the desired scrub of the contact pad 17 in order to ensure the electrical contact thereof with the probe 13.

The straightening of the tip 16 in a position being substantially orthogonal with respect to the contact pad 17 thus provides for a pressing of the covering film 17A having been removed.

Advantageously according to this embodiment of the disclosure, this local milling or digging working of the corrugated contact portion 16A of the contact tip 16 allows, through a reduced-length scrub Sc on the pad with respect to known probes, the correct electrical contact between the probe 13 and the contact pad 17 to be ensured, as indicated in FIGS. 6A and 6B, where A indicates a first-contact starting position of the probe 13 with a contact pad 17 and B indicates a pressure-contact working position between the probe 13 and the pad 17, with subsequent horizontal movement or scrub of the contact tip 16 on the pad itself and vertical movement or overtravel OT of the probe 13.

In particular, the testing head 10 as above described implements the method for cleaning according to the disclosure.

Furthermore, thanks to this testing head 10, a method for contacting a device 18 to be tested can be implemented, comprising the steps of:

getting the corrugated contact portion 16A of each of the contact tips 16 of the probes 13 of the testing head 10 in contact with a corresponding contact pad 17 of the device 18 to be tested;

letting the contact tip 16 penetrate in the covering film 17A of the contact pad 17 by a length P1 of the thickness Th of the covering film 17A;

sticking the contact tip 16 on the contact pad 17 by means of the friction generated by the corrugated contact portion 16A in correspondence with a zone of impact with the covering film 17A;

applying a pressure force on the probe 13 vertically moving the device 18 to be tested towards the testing head 10 and deforming the hook 15;

letting the contact tip 16 move in a rotating way in correspondence with the impact zone locally milling and removing the covering film 17A and etching the underlying pad letting the contact tip 16 penetrate by a length P2 exceeding the thickness Th of the covering film 17A; and realizing the desired electrical contact between the probe 13 of the testing head 10 and the corresponding contact pad 17 of the device 18 to be tested.

Figures 7A, 7B:
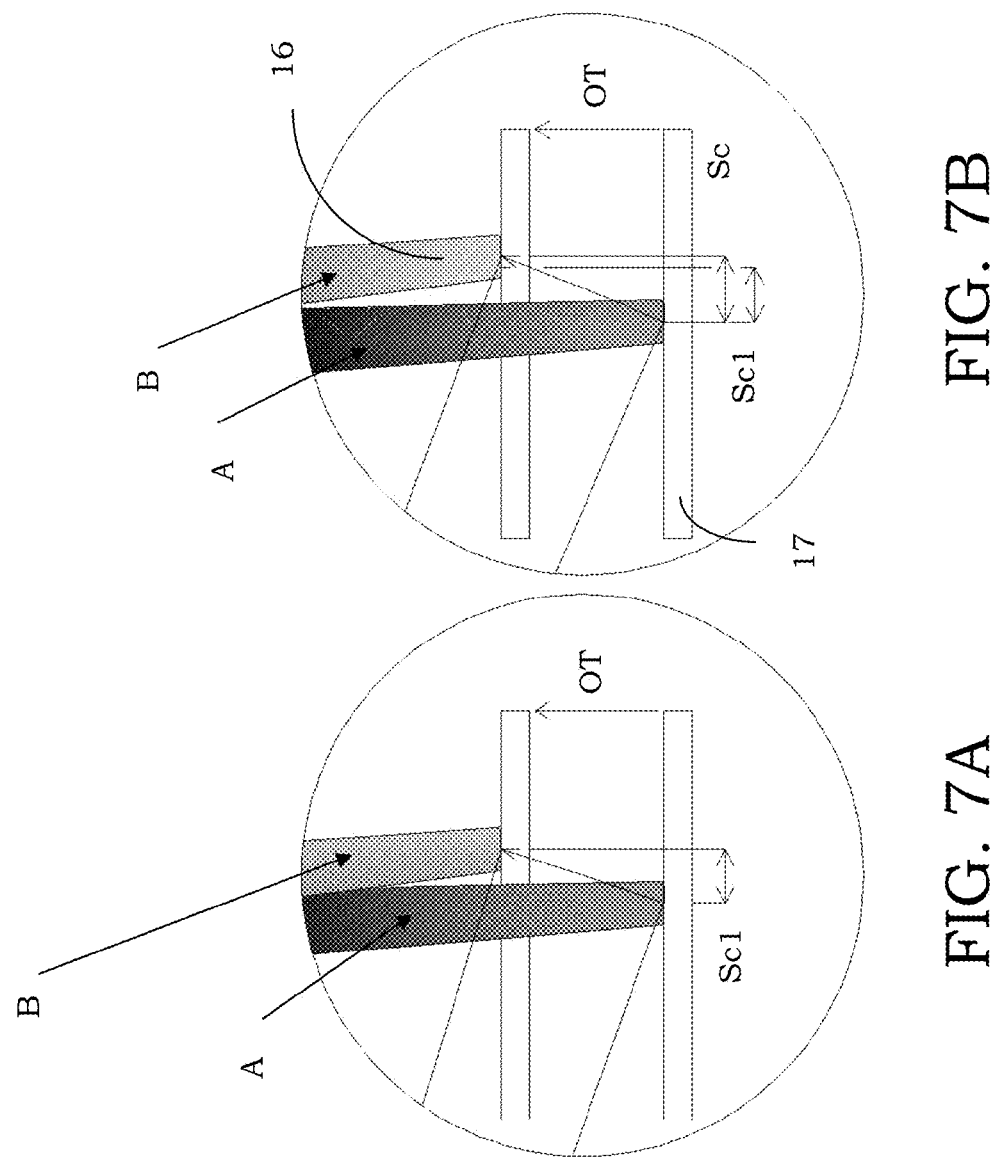
FIGS. 7A and 7B are respective schematic enlarged views of a portion of the cantilever probe of FIG. 2A realized according to the prior art and of a portion of the cantilever probe of FIG. 6A realized according to an embodiment of the disclosure.

FIGS. 7A and 7B are enlarged views of the only portion related to probe contact tips realized according to the prior art and to an embodiment of the disclosure respectively, in the different contact positions with a contact pad. It is evident through the drawings that the scrub Sc obtained by means of the probes 13 according to an embodiment of the disclosure is lower than the one of the probes realized according to the prior art.

Figure 8B:
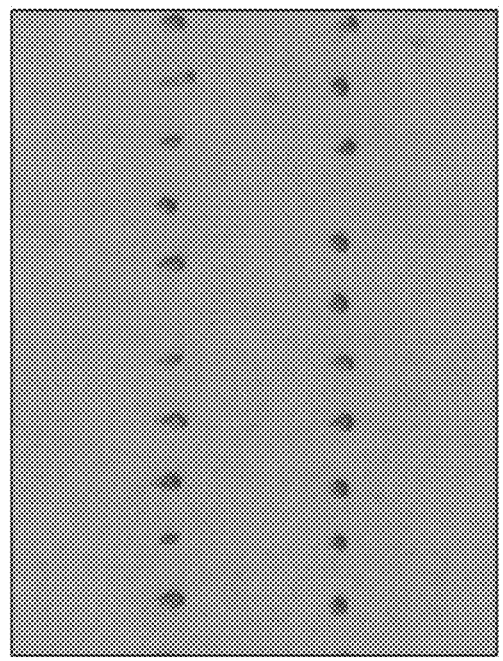
FIGS. 8A and 8B are micrographs related to cantilever probes of testing heads realized according to the prior art and to an embodiment of the disclosure respectively.
Figure 8A:
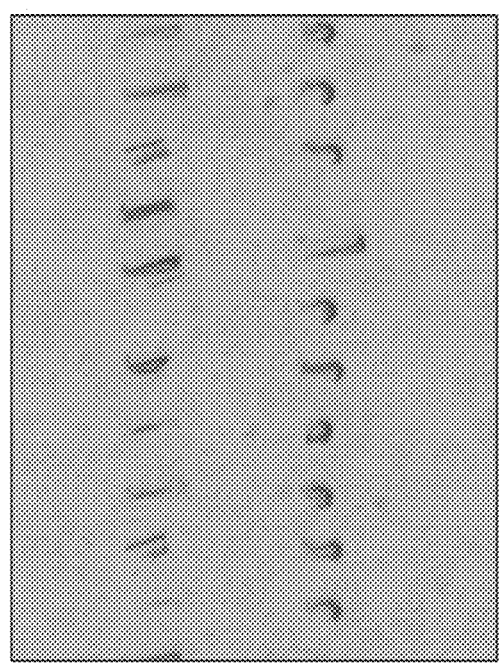

This scrub reduction is also shown by the micrographs of FIGS. 8A and 8B, still related to probes realized according to the prior art and to an embodiment of the disclosure, respectively.

In a preferred embodiment of the disclosure, the probe 13 is made of a tungsten alloy with 3% of rhenium having the feature of elastically bending keeping within an elastic deformation zone with an overtravel up to 70 μm.

Moreover, hooks 15 may have a length (measured from the bending point 19 to the contact tip 16) which is higher than 270 μm±15 μm, preferably 270 μm or even higher than 325 μm±15 μm, preferably 325 μm. This length of the hooks 15, being higher than the lengths generally used by known probes, allows the stiffness thereof to be reduced and the bending thereof during the horizontal scrub movement of the contact tip 16 to be favored. Moreover, it is well known that a stiffness feature of the contact probe hook allows improvements to be achieved in terms of contact pad damage.

Furthermore, the corrugated contact portion 16A has a surface roughness Ra between 1 and 3 micron, preferably 2 micron. This surface roughness allows a sufficient force of friction to be obtained, which is capable to stick the contact tip 16 on the contact pad 17 in correspondence with the impact zone thereof.

Finally, a force is applied to the probe 13, being capable to bend the hook 15 without bringing it in a plastic deformation zone and to ensure the electrical contact, equal to $1.4\pm0.95$ $e^{1.7535}$ g/mil (i.e. for each 25 μm of overtravel).

In conclusion, the method for cleaning according to an embodiment of the disclosure substitutes the known superficial scraping or scrubbing technique of the contact pads in the aim of removing the corresponding oxide layer, with a technique providing a substantial tillage, in particular a local milling of the covering layer or film of the pads themselves.

This method for cleaning the contact pads allows to correctly perform the testing also of state-of-the-art devices, being more and more full of contacts pads and having pads being more and more small, overcoming the drawbacks of the known methods which are based on the superficial scraping of the contact pads.

In particular, the testing head according to an embodiment of the disclosure, comprising tapered-hook and corrugated-contact-tip probes allows reduced-size scrubs to be obtained, ensuring however the correct electrical contact between the probe and the contact pad. In this way, the testing head according to an embodiment of the disclosure is suitable to be used also to test devices with a high number of reduced-size contact pads.

Furthermore, the corrugated contact portion of the contact tip of the probe according to an embodiment of the disclosure ensures a probe sticking in the zone of impact with the contact pad, subsequently deforming the hook and locally micro-milling the pad covering film in order to ensure the correct electrical connection with the probe. Moreover, the hook tapered shape ensures the elastic deformation thereof and the regain of starting conditions after lifting the testing head from the device to be tested, besides decreasing the contact pad damage. Finally, the probe diameter reduction in correspondence with the bending point allows the slant value of the probe body or impact angle to be decreased, contributing to a further reduction of the scrub performed by the probes on contact pads.

From the foregoing it will be appreciated that, although specific embodiments of the disclosure have been described herein for purposes of illustration, various modifications may be made without deviating from the spirit and scope of the disclosure. Accordingly, the disclosure is not limited.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for cleaning a contact pad of a microstructure or device to be tested, the device to be tested being in electric contact with a measure apparatus and comprising at least a flexible probe, the flexible probe electrically contacting the contact pad, the method comprising:
   mechanically engaging a free end of the flexible probe in a manner that sticks the free end in the pad; and
   laterally flexing, by a tip charge, the flexible probe in a manner that keeps the free end stuck in the pad, the free end of the flexible probe being pointed and locally digging into a covering layer of the pad and realizing a localized crushing of the covering layer.

2. The method of claim 1, wherein local crushing of the covering layer of the contact pad is a local removing of the same, substantially by milling.

3. The method of claim 2, wherein milling is obtained by corrugating the pointed free end of the flexible probe.

4. The method of claim 3, wherein flexing of the flexible probe causes a local pressing of a removed portion of the covering layer.

5. The method of claim 4, wherein flexing of the flexible probe causes a substantial straightening of the pointed free end of the flexible probe in a position being substantially orthogonal with respect to the contact pad.

6. A cantilever contact probe comprising:
   at least a probe body;
   a bending point;
   a hook-shaped end portion; and
   a contact tip,
      the hook-shaped end portion slanting from the bending point with respect to said probe body and ending with the contact tip,
      the contact tip being suitable to ensure the mechanical and electrical contact with a contact pad of a device to be tested, and
      the contact pad being covered by a covering film,
   wherein:
      the hook-shaped end portion is tapered and has a reduced diameter in correspondence with said bending point, and
      the contact tip comprises a suitably-corrugated contact portion able to abut against the covering film overhanging the contact pad.

7. The cantilever contact probe of claim 6, wherein the corrugated contact portion has a surface roughness being suitable to obtain a sufficient force of friction which is able to stick the contact tip on the contact pad in correspondence with an impact zone.

8. The cantilever contact probe of claim 7, wherein the corrugated contact portion has a surface roughness between 1 and 3 microns.

9. The cantilever contact probe of claim 6, wherein the hook-shaped end portion has a diameter in correspondence with the bending point having a value comprised between 10% and 30% of a value of a diameter of a conventional probe for a same application.

10. The cantilever contact probe of claim 6, wherein the hook-shaped end portion has a diameter in correspondence with the bending point having a value greater than a diameter of the contact tip, for approximately 15 μm.

11. The cantilever contact probe of claim 6, wherein the probe body, bending point, and hook-shaped end portion are made of a tungsten alloy with 3% of rhenium and are configured to elastically bend, keeping within an elastic deformation zone with a vertical movement of said probe up to 70 μm.

12. The cantilever contact probe of claim 6, wherein the hook-shaped end portion has a length measured from the bending point to the contact tip which is equal to 325 μm±15 μm.

13. The cantilever contact probe of claim 6, wherein the hook-shaped end portion bends with an angle β with respect to a perpendicular to the device to be tested comprised between 2° and 4°.

14. A cantilever-probe testing head comprising:
   at least a support; and
   a plurality of contact probes,
      the support being configured to incorporate a plurality of contact probes, each contact probe comprising:
  at least a probe body;
  a bending point;
  a hook-shaped end portion; and
  a contact tip,
    the hook-shaped end portion slanting from the bending point with respect to said probe body and ending with the contact tip,
    the contact tip being suitable to ensure the mechanical and electrical contact with a contact pad of a device to be tested, and
    the contact pad being covered by a covering film,
  wherein:
    the hook-shaped end portion is tapered and has a reduced diameter in correspondence with said bending point, and
    the contact tip comprises a suitably-corrugated contact portion able to abut against the covering film overhanging the contact pad.

15. The testing head of claim 14, wherein the contact probes project in a cantilever way over the device to be tested with an angle α, defined by the slant of the probe with respect to a plane defined by the device to be tested, comprised between 4° and 8°.

16. A method for contacting a device to be tested by a testing head which comprises:
  at least a support, and
  a plurality of contact probes,
  the support being configured to incorporate a plurality of contact probes, and
  each contact probe comprising:
    at least a probe body;
    a bending point;
    a hook-shaped end portion; and
    a contact tip,
      the hook-shaped end portion slanting from the bending point with respect to said probe body and ending with the contact tip,
      the contact tip being suitable to ensure the mechanical and electrical contact with a contact pad of a device to be tested, and
      the contact pad being covered by a covering film,
  wherein:
    the hook-shaped end portion is tapered and has a reduced diameter in correspondence with said bending point, and
    the contact tip comprises a suitably-corrugated contact portion able to abut against the covering film overhanging the contact pad,
  the method comprising the steps of:
    getting the corrugated contact portion of each of the contact tips in contact with a corresponding contact pad;
    letting the contact tip penetrate in the covering film of the contact pad by a length of a thickness of the covering film;
    sticking the contact tip on the contact pad by friction generated by the corrugated contact portion in correspondence with a zone of impact with the covering film;
    applying a pressure force on the probe vertically moving said device to be tested towards the testing head and elastically deforming the hook-shaped end portion of the probe;
    letting the contact tip move in a rotating way in correspondence with the zone of impact with the covering film locally milling and removing the covering film and etching the underlying contact pad letting the contact tip penetrate by a length exceeding said thickness of the covering film; and
    realizing a desired electrical contact between the probe and the contact pad.

17. A method for cleaning a contact pad of a microstructure or device to be tested, the device to be tested being in electric contact with a measure apparatus that includes at least a flexible probe,
  the flexible probe comprising:
    at least a probe body;
    a bending point;
    a hook-shaped end portion; and
    a contact tip,
      the hook-shaped end portion slanting from the bending point with respect to the probe body and ending with the contact tip, electrically contacting the contact pad,
  the method comprising:
    mechanically engaging the contact tip of the flexible probe, which has a corrugated contact portion and is stuck in the contact pad thanks to such a corrugated contact portion; and
    laterally flexing, by a tip charge, the hook-shaped end portion of the flexible probe in an elastic manner and keeping the contact tip stuck in the contact pad, thanks to a reduced diameter of the flexible probe in correspondence with the bending point; and
    moving in a rotating way the contact tip of the flexible probe in correspondence with a zone of impact with a covering layer of the contact pad,
  the free end of the flexible probe being pointed and locally digging the corrugated contact portion of the flexible probe into the covering layer and realizing a localized crushing of the covering layer so as to locally remove the same, substantially by milling, thanks to the corrugated contact portion of the flexible probe.

18. The method of claim 17, wherein flexing of the flexible probe causes a local pressing of a removed portion of the covering layer.

19. The method of claim 18, wherein flexing of the flexible probe causes a substantial straightening of the pointed free end of the flexible probe in a position being substantially orthogonal with respect to the contact pad.

20. A cantilever contact probe comprising:
  at least a probe body;
  a bending point;
  a hook-shaped end portion; and
  a contact tip,
    the hook-shaped end portion slanting from the bending point with respect to said probe body and ending with the contact tip,
    the contact tip being suitable to ensure the mechanical and electrical contact with a contact pad of a device to be tested,
    the contact pad being covered by a covering film,
  wherein:
    the hook-shaped end portion is tapered and has a reduced diameter in correspondence with said bending point, and
    the contact tip comprises a suitably-corrugated contact portion being able to abut against the covering film overhanging the contact pad, the hook-shaped end portion of the cantilever contact probe being configured to realize a lateral flexing in an elastic manner and a local removing by milling of the covering film of the contact pad by moving the contact tip in a rotating way in correspondence with a zone of impact with the covering film.

21. The cantilever contact probe of claim 20, wherein the corrugated contact portion has a surface roughness suitable to obtain a sufficient force of friction which is able to stick the contact tip on the contact pad in correspondence with an impact zone.

22. The cantilever contact probe of claim 21, wherein the corrugated contact portion has a surface roughness between 1 and 3 micron.

23. The cantilever contact probe of claim 20, wherein the hook-shaped end portion has a diameter in correspondence with the bending point having a value comprised between 10% and 30% of a value of a diameter of a conventional probe for a same application.

24. The cantilever contact probe of claim 20, wherein the hook-shaped end portion has a diameter in correspondence with the bending point having a value greater than a diameter of the contact tip, for approximately 15 μm.

25. The cantilever contact probe of claim 20, wherein the probe body, bending point, and hook-shaped end portion are made of a tungsten alloy with 3% of rhenium and are configured to elastically bend, keeping within an elastic deformation zone with a vertical movement of said probe up to 70 μm.

26. The cantilever contact probe of claim 20, wherein the hook-shaped end portion has a length measured from the bending point to the contact tip which is equal to 325 μm±15 μm.

27. The cantilever contact probe of claim 20, wherein the hook-shaped end portion bends with an angle $\beta$ with respect to a perpendicular to the device to be tested comprised between 2° and 4°.

28. A cantilever-probe testing head comprising:
at least a support; and
a plurality of contact probes,
the support being configured to incorporate a plurality of contact probes,
each contact probe comprising:
at least a probe body;
a bending point;
a hook-shaped end portion; and
a contact tip,
the hook-shaped end portion slanting from the bending point with respect to said probe body and ending with the contact tip,
the contact tip being suitable to ensure the mechanical and electrical contact with a contact pad of a device to be tested, and
the contact pad being covered by a covering film,
wherein:
the hook-shaped end portion is tapered and has a reduced diameter in correspondence with said bending point, and
the contact tip comprises a suitably-corrugated contact portion able to abut against the covering film overhanging the contact pad, the hook-shaped end portion of the cantilever contact probe being configured to realize a lateral flexing in an elastic manner and a local removing by milling of the covering film of the contact pad by moving the contact tip in a rotating way in correspondence with a zone of impact with the covering film.

29. The testing head of claim 28, wherein the contact probes project in a cantilever way over the device to be tested with an angle $\alpha$, defined by the slant of the probe with respect to a plane defined by the device to be tested, comprised between 4° and 8°.

* * * * *